US012653025B2

(12) United States Patent
Li et al.

(10) Patent No.: US 12,653,025 B2
(45) Date of Patent: Jun. 9, 2026

(54) METHOD OF FORMING SEMICONDUCTOR STRUCTURE AND SEMICONDUCTOR STRUCTURE

(71) Applicant: CHANGXIN MEMORY TECHNOLOGIES, INC., Hefei City (CN)

(72) Inventors: Ting Li, Hefei City (CN); Hou-Hong Chou, Hefei City (CN)

(73) Assignee: ChangXin Memory Technologies, Inc., Hefei (CN)

( * ) Notice: Subject to any disclaimer, the term of this patent is extended or adjusted under 35 U.S.C. 154(b) by 781 days.

(21) Appl. No.: 18/150,275

(22) Filed: Jan. 5, 2023

(65) Prior Publication Data

US 2023/0163025 A1      May 25, 2023

Related U.S. Application Data

(63) Continuation of application No. PCT/CN2021/138392, filed on Dec. 15, 2021.

(30) Foreign Application Priority Data

Aug. 25, 2021    (CN) .......................... 202110984437.3

(51) Int. Cl.
        *H10W 20/46*        (2026.01)
        *H10W 20/00*        (2026.01)
        *H10W 20/45*        (2026.01)
(52) U.S. Cl.
        CPC ......... *H10W 20/46* (2026.01); *H10W 20/072* (2026.01); *H10W 20/074* (2026.01); *H10W 20/0765* (2026.01); *H10W 20/455* (2026.01)
(58) Field of Classification Search
        CPC ............ H10W 20/072; H10W 20/0765; H01L 21/7682; H01L 2221/1063
        See application file for complete search history.

(56) References Cited

U.S. PATENT DOCUMENTS 6,228,763 B1 *    5/2001    Lee ..................... H01L 21/7682
                                                                    257/E23.152
8,298,911 B2 *    10/2012    Lee ..................... H01L 21/7682
                                                                    438/653
(Continued)

FOREIGN PATENT DOCUMENTS

CN            109994474 A        7/2019
CN            110880476 A        3/2020
(Continued)

OTHER PUBLICATIONS

International Search Report cited in PCT/CN2021/138392 mailed May 7, 2022, 10 pages.

*Primary Examiner* — Daniel Luke
(74) *Attorney, Agent, or Firm* — Intellectual Valley Law, P.C.

(57) ABSTRACT

A method of forming a semiconductor structure and a semiconductor structure are provided. The method of forming the semiconductor structure includes: providing a base, where the base includes a first dielectric layer and pads arranged at intervals in the first dielectric layer; forming a dielectric structure, where the dielectric structure exposes the pad and part of the first dielectric layer; forming an insulating structure, where the insulating structure is formed on a sidewall of the dielectric structure, the insulating structure covers a first partial sidewall of the dielectric structure, and an air gap is formed between a second partial sidewall of the dielectric structure and the insulating structure; and forming a conductive structure, where the conductive structure covers an exposed pad and an outer sidewall surface of the insulating structure.

11 Claims, 10 Drawing Sheets

(56)         References Cited

U.S. PATENT DOCUMENTS

| | | | |
|---|---|---|---|
| 11,145,540 | B2 | 10/2021 | Lai |
| 11,152,374 | B2 | 10/2021 | Kim et al. |
| 2014/0131872 | A1 | 5/2014 | Lu et al. |
| 2021/0335655 | A1* | 10/2021 | Hsueh ................. H01L 21/7682 |

FOREIGN PATENT DOCUMENTS

| | | | |
|---|---|---|---|
| CN | 112349681 A | 2/2021 |
| CN | 113707602 A | 11/2021 |

* cited by examiner

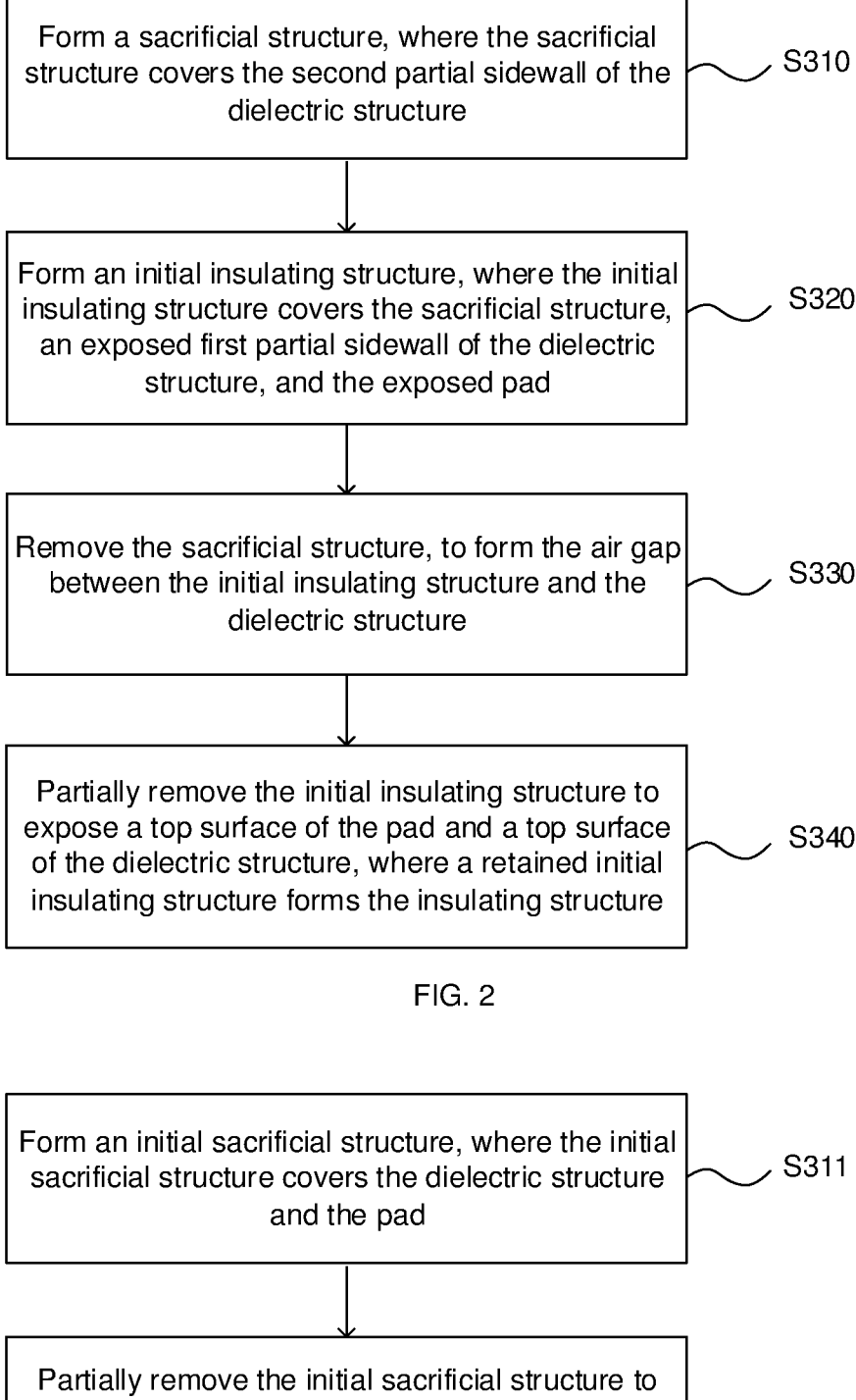

Form a sacrificial structure, where the sacrificial structure covers the second partial sidewall of the dielectric structure — S310

Form an initial insulating structure, where the initial insulating structure covers the sacrificial structure, an exposed first partial sidewall of the dielectric structure, and the exposed pad — S320

Remove the sacrificial structure, to form the air gap between the initial insulating structure and the dielectric structure — S330

Partially remove the initial insulating structure to expose a top surface of the pad and a top surface of the dielectric structure, where a retained initial insulating structure forms the insulating structure — S340

FIG. 2

Form an initial sacrificial structure, where the initial sacrificial structure covers the dielectric structure and the pad — S311

Partially remove the initial sacrificial structure to expose the pad, where a retained initial sacrificial structure covers the second partial sidewall of the dielectric structure to form the sacrificial structure — S312

FIG. 3

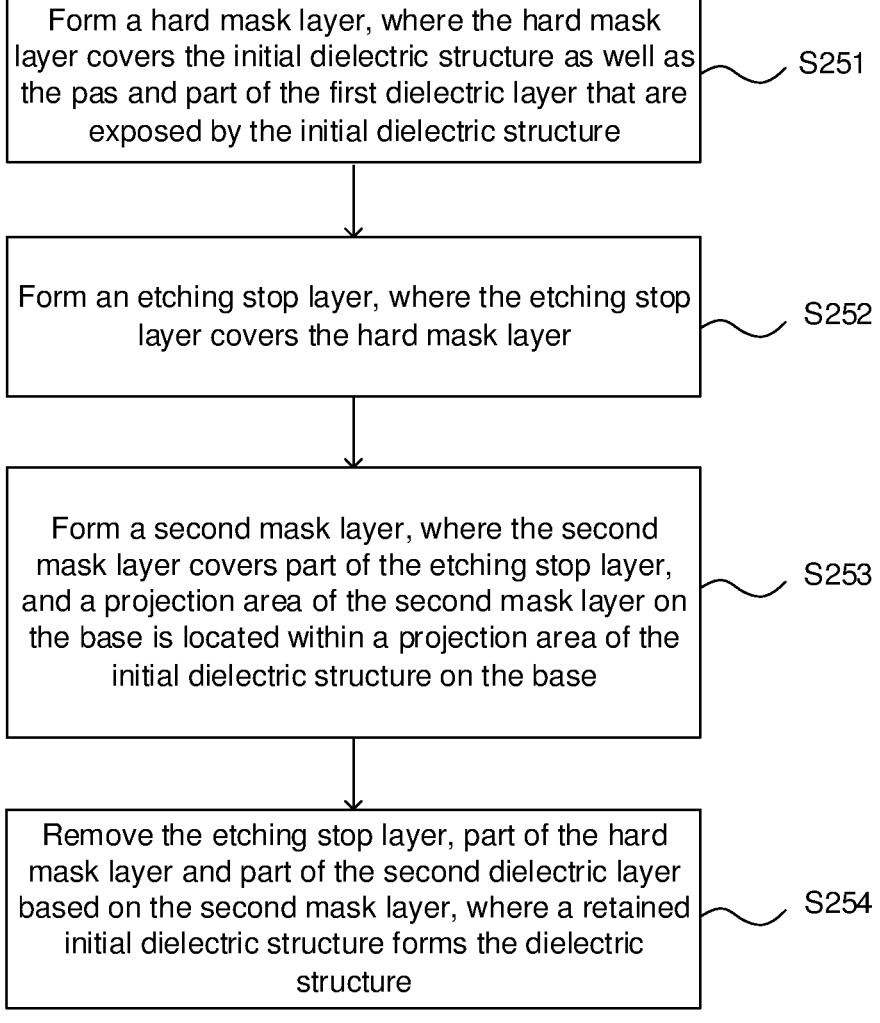

Form a hard mask layer, where the hard mask layer covers the initial dielectric structure as well as the pas and part of the first dielectric layer that are exposed by the initial dielectric structure ～ S251

Form an etching stop layer, where the etching stop layer covers the hard mask layer ～ S252

Form a second mask layer, where the second mask layer covers part of the etching stop layer, and a projection area of the second mask layer on the base is located within a projection area of the initial dielectric structure on the base ～ S253

Remove the etching stop layer, part of the hard mask layer and part of the second dielectric layer based on the second mask layer, where a retained initial dielectric structure forms the dielectric structure ～ S254

FIG. 6

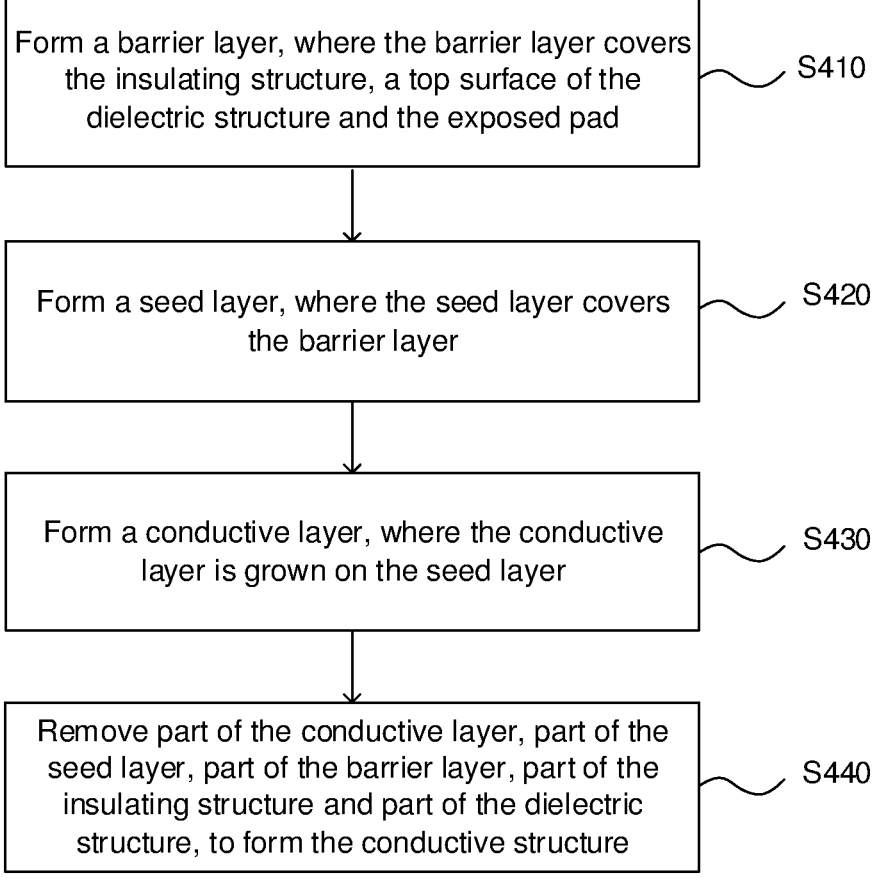

Form a barrier layer, where the barrier layer covers the insulating structure, a top surface of the dielectric structure and the exposed pad    S410

Form a seed layer, where the seed layer covers the barrier layer    S420

Form a conductive layer, where the conductive layer is grown on the seed layer    S430

Remove part of the conductive layer, part of the seed layer, part of the barrier layer, part of the insulating structure and part of the dielectric structure, to form the conductive structure    S440

FIG. 7

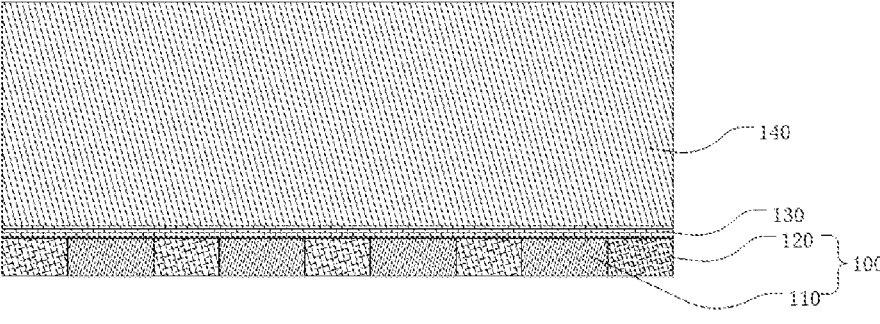

FIG. 8

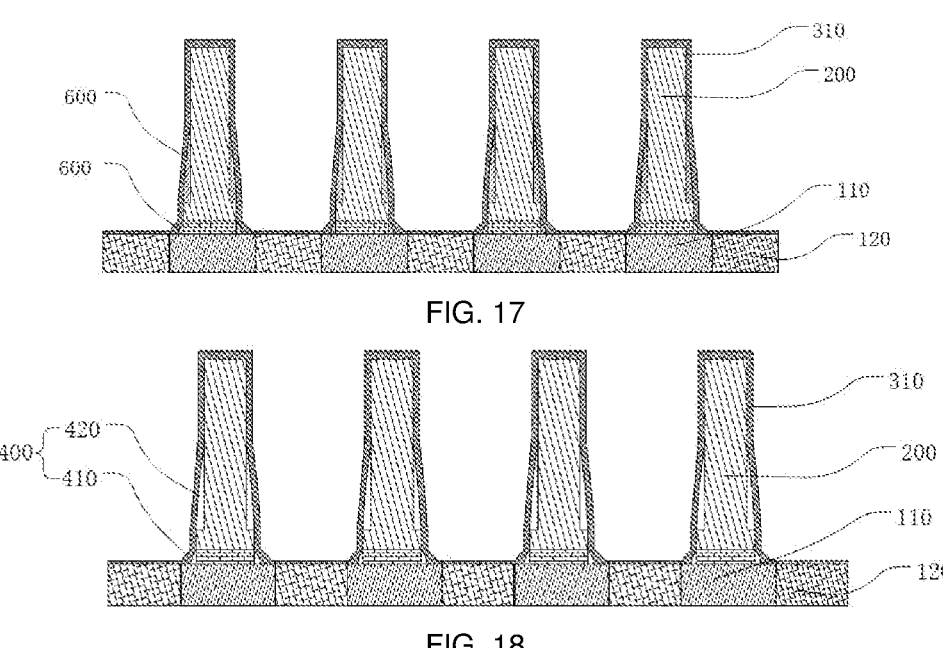
FIG. 17
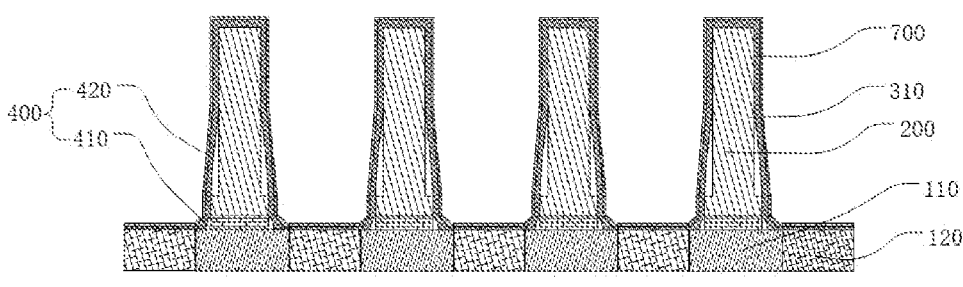
FIG. 18
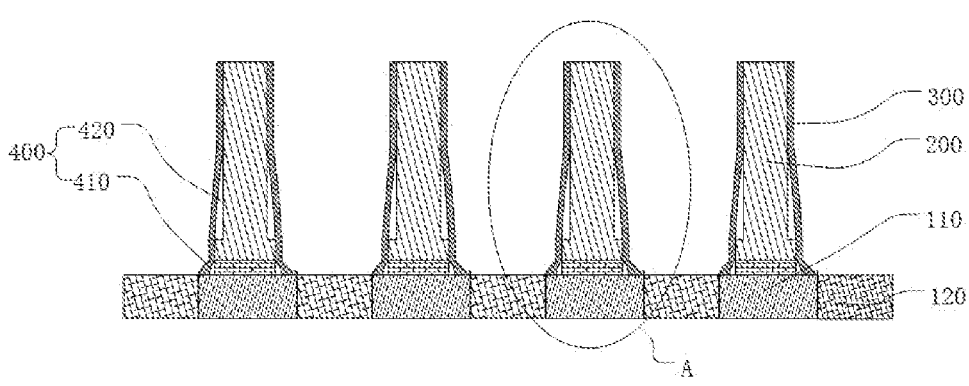
FIG. 19
FIG. 20

METHOD OF FORMING SEMICONDUCTOR STRUCTURE AND SEMICONDUCTOR STRUCTURE

CROSS-REFERENCE TO RELATED APPLICATIONS

This is a continuation of International Application No. PCT/CN2021/138392, filed on Dec. 15, 2021, which claims the priority to Chinese Patent Application No. 202110984437.3, titled "METHOD OF FORMING SEMICONDUCTOR STRUCTURE AND SEMICONDUCTOR STRUCTURE" and filed on Aug. 25, 2021. The entire contents of International Application No. PCT/CN2021/ 138392 and Chinese Patent Application No. 202110984437.3 are incorporated herein by reference.

TECHNICAL FIELD

The present disclosure relates to, but is not limited to, a method of forming a semiconductor structure and a semiconductor structure.

BACKGROUND

As the integration of integrated circuits continues to increase, the critical dimension of transistors continues to shrink and the spacing between interconnect leads decreases. Parasitic capacitance between interconnect leads is inversely proportional to the spacing between the interconnect leads. The increase in the parasitic capacitance between the interconnect leads results in a significant increase in the resistor-capacitor (RC) delay in the back-end interconnect structure.

SUMMARY

An overview of the subject described in detail in the present disclosure is provided below. This overview is not intended to limit the protection scope of the claims.

The present disclosure provides a method of forming a semiconductor structure and a semiconductor structure.

According to a first aspect, the present disclosure provides a method of forming a semiconductor structure. The forming method includes:

provided a base, where the base includes a first dielectric layer and pads arranged at intervals in the first dielectric layer;

forming a dielectric structure, where the dielectric structure exposes the pad and part of the first dielectric layer;

forming an insulating structure, where the insulating structure is formed on a sidewall of the dielectric structure, the insulating structure covers a first partial sidewall of the dielectric structure, and an air gap is formed between a second partial sidewall of the dielectric structure and the insulating structure; and forming a conductive structure, where the conductive structure covers an exposed pad and an outer sidewall surface of the insulating structure.

A second aspect of the present disclosure provides a semiconductor structure, including:

a base, where the base includes a first dielectric layer and pads arranged at intervals in the first dielectric layer;

a dielectric structure, where the dielectric structure exposes the pad and part of the first dielectric layer, a projection area of the dielectric structure on the base is located within an area of the first dielectric layer, and the projection area of the dielectric structure on the base is smaller than the area of the first dielectric layer;

an insulating structure, where the insulating structure is arranged on a sidewall of the dielectric structure, the insulating structure covers a first partial sidewall of the dielectric structure, and an air gap is provided between a second partial sidewall of the dielectric structure and the insulating structure; and a conductive structure, where the conductive structure covers an exposed pad and an outer sidewall surface of the insulating structure.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

FIG. 2 is a flowchart of forming insulating structures in a method of forming a semiconductor structure according to an exemplary embodiment.

FIG. 3 is a flowchart of forming sacrificial structures in a method of forming a semiconductor structure according to an exemplary embodiment.

FIG. 6 is a schematic diagram of partially removing an initial dielectric structure to form a dielectric structure in a method of forming a semiconductor structure according to an exemplary embodiment.

FIG. 7 is a flowchart of forming conductive structures in a method of forming a semiconductor structure according to an exemplary embodiment.

FIG. 8 is a schematic diagram of forming an isolation layer and a second dielectric layer in a base in a method of forming a semiconductor structure according to an exemplary embodiment.

FIG. 17 is a schematic diagram of forming initial insulating structures in a method of forming a semiconductor structure according to an exemplary embodiment.

FIG. 18 is a schematic diagram of removing a sacrificial structure to form an air gap in a method of forming a semiconductor structure according to an exemplary embodiment.

FIG. 19 is a schematic diagram of forming auxiliary structures in a method of forming a semiconductor structure according to an exemplary embodiment.

FIG. 20 is a schematic diagram of forming insulating structures in a method of forming a semiconductor structure according to an exemplary embodiment.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

To reduce a resistor capacitor delay of interconnect leads in the back-end of an integrated circuit process, copper is used as an interconnect material in replacement of aluminum. Since a copper compound volatilizes at a temperature higher than an operating temperature in semiconductor production, plasma cannot react with copper to produce a volatile byproduct. That is, as an interconnect material, copper cannot be wired by dry etching. In the related technology, the copper damascene process is used to realize the wiring process of the back-end interconnect of copper as an interconnect material, including the following steps:

depositing a low-K dielectric material on a planar substrate to form a second dielectric layer;

forming inlaid vias and trenches in the second dielectric layer by photolithography and etching processes;

depositing a metal barrier layer and a copper seed crystal layer, and plating copper to fill up the vias and trenches in the second dielectric layer; and performing chemical mechanical polishing (CMP) planarization to remove excess metal from the second dielectric layer, to form planar copper interconnects.

However, in the damascene process, inlaid vias and trenches are formed in the second dielectric layer, resulting in high parasitic capacitance between the interconnect leads of the semiconductor structure.

Figure 1:
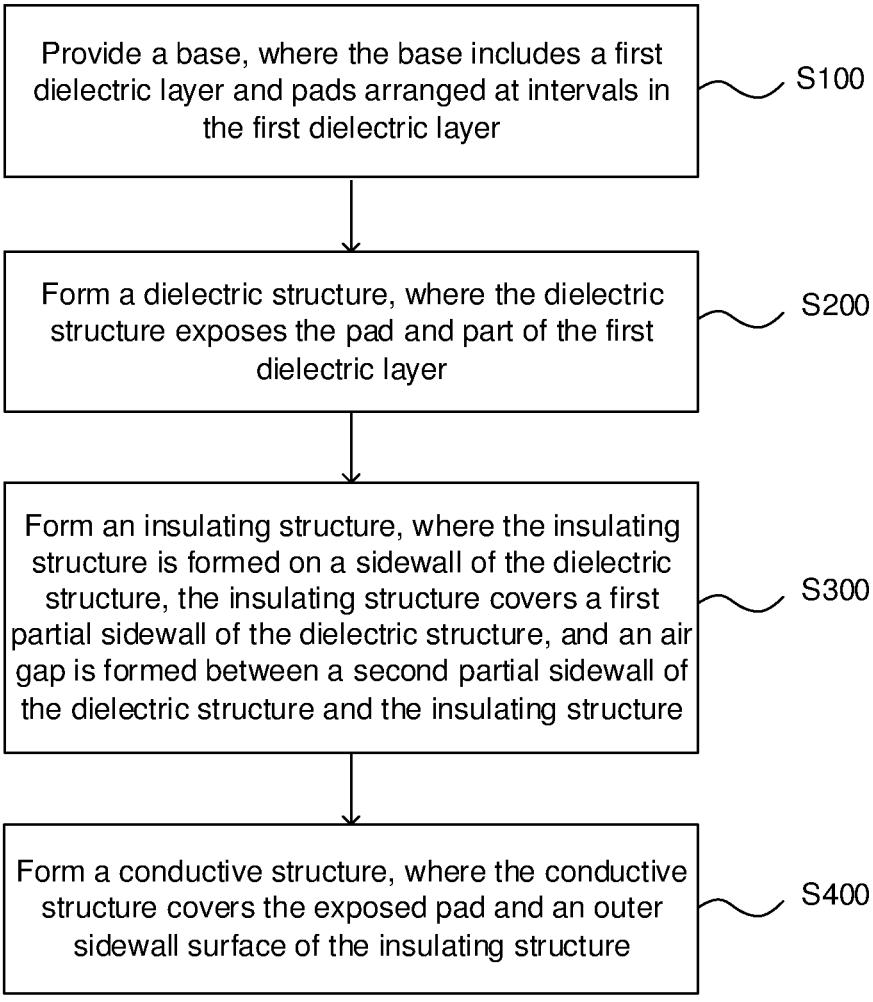
FIG. 1 is a flowchart of a method of forming a semiconductor structure according to an exemplary embodiment.

An exemplary embodiment of the present disclosure provides a method of forming a semiconductor structure, as shown in FIG. 1. FIG. 1 is a flowchart of method of a forming a semiconductor structure according to an exemplary embodiment of the present disclosure. FIG. 8 to FIG. 25 are schematic diagrams of various stages of the method of forming a semiconductor structure. The method of forming a semiconductor structure is described below with reference to FIG. 8 to FIG. 25.

The semiconductor structure is not limited in this embodiment. The semiconductor structure is described below by taking a dynamic random access memory (DRAM) as an example, but this embodiment is not limited to this, and the semiconductor structure in this embodiment may also be other structures.

As shown in FIG. 1, an exemplary embodiment of the present disclosure provides a method of forming a semiconductor structure. The forming method includes the following steps:

Step S100: Provide a base, where the base includes a first dielectric layer and pads arranged at intervals in the first dielectric layer.

As shown in FIG. 8, the base 100 includes a first dielectric layer 110 and pads 120 arranged at intervals in the first dielectric layer 110. A material of the first dielectric layer 110 may include silicon oxide ($SiO_2$), silicon nitride (SiN), or silicon oxynitride (SiON). For example, the first dielectric layer 110 may include fluorine-doped silicon oxide, carbon-doped silicon oxide, porous silicon oxide, porous carbon-doped silicon oxide, an organic polymer, or a silicone-based polymer. In this embodiment, the first dielectric layer 110 include an oxide such as undoped silicate glass (USG), boron-silicate glass (BSG), phospho-silicate Glass (PSG), or boro-phospho-silicate glass (BPSG).

As shown in FIG. 8, the pad 120 may be a metal pad. For example, the pad 120 may be a metal pad including copper.

Step S200: Form a dielectric structure, where the dielectric structure exposes the pad and part of the first dielectric layer.

Figure 13:
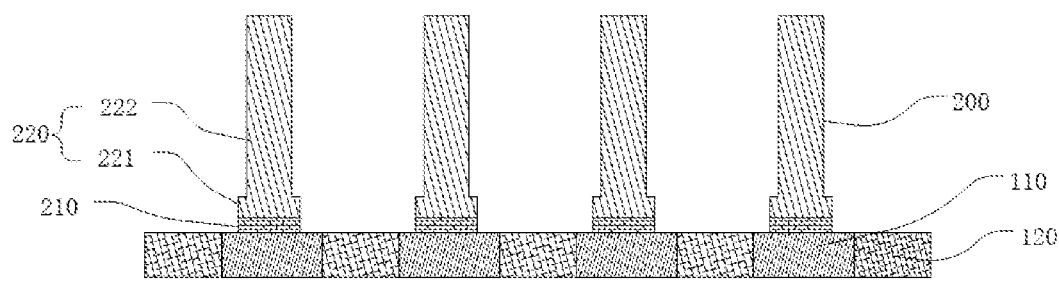
FIG. 13 is a schematic diagram of forming dielectric structures in a method of forming a semiconductor structure according to an exemplary embodiment.

As shown in FIG. 13, the dielectric structure 200 is formed on a top surface of the base 100. The dielectric structure 200 is arranged on the first dielectric layer 110. The dielectric structure 200 exposes a top surface of the pad 120 and a partial top surface of the first dielectric layer 110.

Step S300: Form an insulating structure, where the insulating structure is formed on a sidewall of the dielectric structure, the insulating structure covers a first partial sidewall of the dielectric structure, and an air gap is formed between a second partial sidewall of the dielectric structure and the insulating structure.

Figure 21:
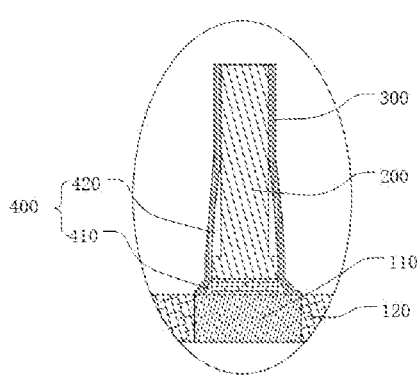
FIG. 21 is a partial enlarged view of position A in FIG. 20.

As shown in FIG. 20 and FIG. 21, after the insulating structure 300 is formed, the insulating structure 300 and the air gap 400 cover the first dielectric layer 110 exposed by the dielectric structure 200 and expose the top surface of the pad 120. The sidewall of the insulating structure 300 and the exposed pad 120 defines a trench located between two adjacent insulating structures 300.

A material of the insulating structure 300 may include silicon oxide ($SiO_2$), silicon nitride (SiN) or silicon oxynitride (SiON).

Step S400: Form a conductive structure, where the conductive structure covers an exposed pad and an outer sidewall surface of the insulating structure.

Figure 25:
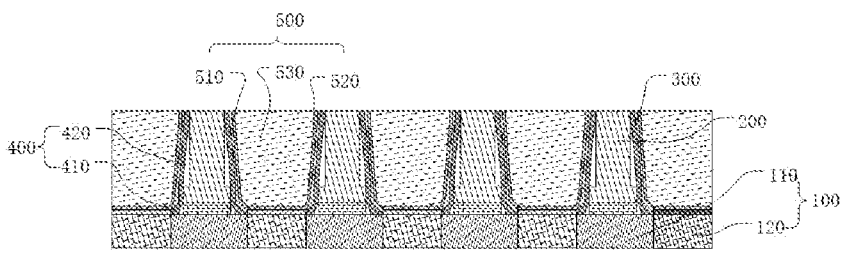
FIG. 25 is a schematic diagram of forming conductive structures in a method of forming a semiconductor structure according to an exemplary embodiment.

As shown in FIG. 25, the conductive structure 500 is made of at least one from the group consisting of copper and tungsten.

In the semiconductor structure formed in this embodiment, the conductive structure is formed in the trench formed by the sidewall of the insulating structure and the exposed pad, and adjacent conductive structures are separated by the dielectric structure, the insulating structure, and the air gap. The air gap has a low dielectric constant, thereby reducing the parasitic capacitance between the conductive structures.

According to an exemplary embodiment, this embodiment is a description of the implementation of step S300 of the foregoing embodiment. As shown in FIG. 2, FIG. 2 is a flowchart of step S300 of forming insulating structures in a method of forming a semiconductor structure according to this embodiment, including the following steps:

Step S310: Form a sacrificial structure, where the sacrificial structure covers the second partial sidewall of the dielectric structure.

Figure 15:
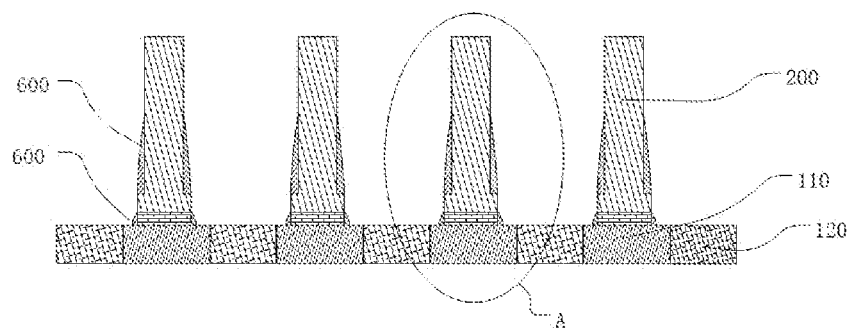
FIG. 15 is a schematic diagram of forming a sacrificial structure in a method of forming a semiconductor structure according to an exemplary embodiment.
Figure 16:
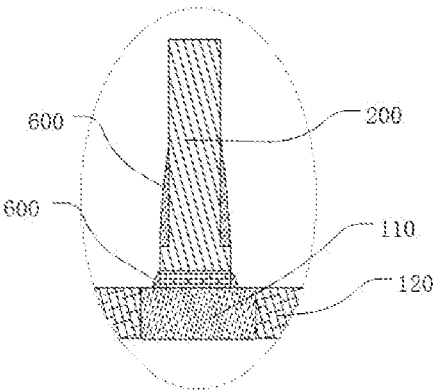
FIG. 16 is a partial enlarged view of position A in FIG. 15.

As shown in FIG. 15 and FIG. 16, the sacrificial structure 600 may be formed through chemical vapor deposition (CVD). A material of the sacrificial structure 600 may include carbide that can react with oxygen plasma to produce a gas. The sacrificial structure 600 covers a partial sidewall of the dielectric structure 200.

In this embodiment, the position and area of the sidewall of the dielectric structure 200 covered by the sacrificial structure 600 are used to define the position and size of the air gap 400 formed in the subsequent step. In this embodiment, the sacrificial structure 600 covers the second partial sidewall of the dielectric structure 200 and exposes the first partial sidewall of the dielectric structure 200.

Step S320: Form an initial insulating structure, where the initial insulating structure covers the sacrificial structure, an exposed first partial sidewall of the dielectric structure, and the exposed pad.

As shown in FIG. 17, the initial insulating structure 310 may be formed through atomic layer deposition (ALD). A material of the initial insulating structure 310 may include silicon oxide ($SiO_2$), silicon nitride (SiN) or silicon oxynitride (SiON).

Step S330: Remove the sacrificial structure, to form an air gap between the initial insulating structure and the dielectric structure.

The sacrificial structure 600 may be removed through release of oxygen plasma, to form an air gap 400 between the initial insulating structure 310 and the dielectric structure 200.

Step S340: Partially remove the initial insulating structure to expose a top surface of the pad and a top surface of the dielectric structure, where a retained initial insulating structure forms the insulating structure.

As shown in FIG. 20, the initial insulating structure 310 is partially removed through dry etching to expose the top surface of the pad 120 and the top surface of the dielectric structure 200. The retained initial insulating structure 310 forms the insulating structure 300. The insulating structure 300 covers the first partial sidewall of the dielectric structure

200, and the air gap 400 is formed between the second partial sidewall of the dielectric structure 200 and the insulating structure 300.

In this embodiment, the sacrificial structure 600 may be removed by etching through reaction with oxygen-containing plasma. The semiconductor structure in step S320 is placed in a plasma reaction chamber, and a dissociation gas is injected into the plasma reaction chamber, where the dissociation gas may be a gas from which oxygen plasma can be dissociated. At a high temperature, the dissociation gas is excited by radio frequency to dissociate oxygen plasma, and the sacrificial structure 600 is removed through reaction of the oxygen plasma, so as to form, between the initial insulating structure 310 and the dielectric structure 200, the air gap 400 at the original position of the sacrificial structure 600. In this embodiment, the air gap 400 is formed between the initial insulating structure 310 and the second partial sidewall of the dielectric structure 200.

In this embodiment, the air gap between the dielectric structure and the initial insulating structure is formed by forming a sacrificial structure between a partial sidewall of the dielectric structure and the initial insulating structure and then removing the sacrificial structure, such that the formed air gap is provided between the dielectric structure and the initial insulating structure in a sealed manner. The air gap formed by removing the sacrificial structure through oxygen plasma has higher yield, which avoids collapse of the initial insulating structure caused by formation of the air gap through etching.

According to an exemplary embodiment, this embodiment is a description of the implementation of step S310 of the foregoing embodiment. As shown in FIG. 3, FIG. 3 is a flowchart of step S310 of forming sacrificial structures in a method of forming a semiconductor structure according to this embodiment, including the following steps:

Step S311: Form an initial sacrificial structure, where the initial sacrificial structure covers the dielectric structure and the pad.

Figure 14:
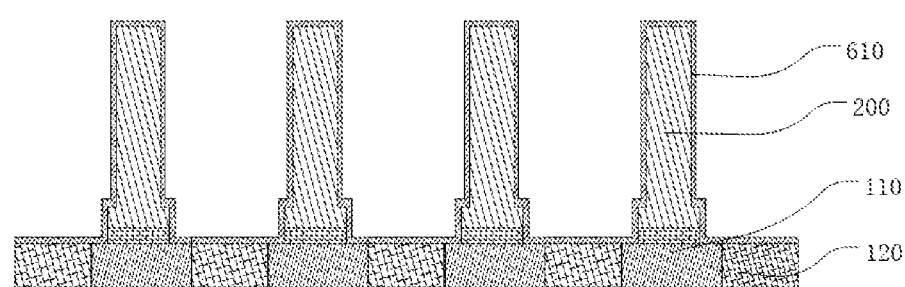
FIG. 14 is a schematic diagram of forming initial sacrificial structures in a method of forming a semiconductor structure according to an exemplary embodiment.

As shown in FIG. 14 with reference to FIG. 13, the initial sacrificial structure 610 may be formed through atomic layer deposition (ALD). A material of the initial sacrificial structure 610 may include carbide that can react with oxygen plasma to produce a gas.

Step S312: Partially remove the initial sacrificial structure to expose the pad, where a retained initial sacrificial structure covers the second partial sidewall of the dielectric structure to form the sacrificial structure.

As shown in FIG. 15 and FIG. 16 with reference to FIG. 14, the initial sacrificial structure 610 may be etched anisotropically through dry etching, where an etching speed in a vertical direction is higher than an etching speed in a horizontal direction, to remove the initial sacrificial structure 610 covering the top surface of the pad 120 and the top surface of the dielectric structure 200 as well as the initial sacrificial structure 610 covering the first partial sidewall of the dielectric structure 200. The retained initial sacrificial structure 610 forms the sacrificial structure 600, and the sacrificial structure 600 covers the second partial sidewall of the dielectric structure 200.

In this embodiment, the air gap between the dielectric structure and the initial insulating structure is formed by forming a sacrificial structure between a partial sidewall of the dielectric structure and the initial insulating structure and then removing the sacrificial structure, such that the formed air gap is provided between the dielectric structure and the initial insulating structure in a sealed manner. A material of the sacrificial structure includes carbide. The air gap formed by removing the sacrificial structure through oxygen plasma has higher yield, which avoids collapse of the initial insulating structure caused by formation of the air gap through etching.

Figures 4, 5:
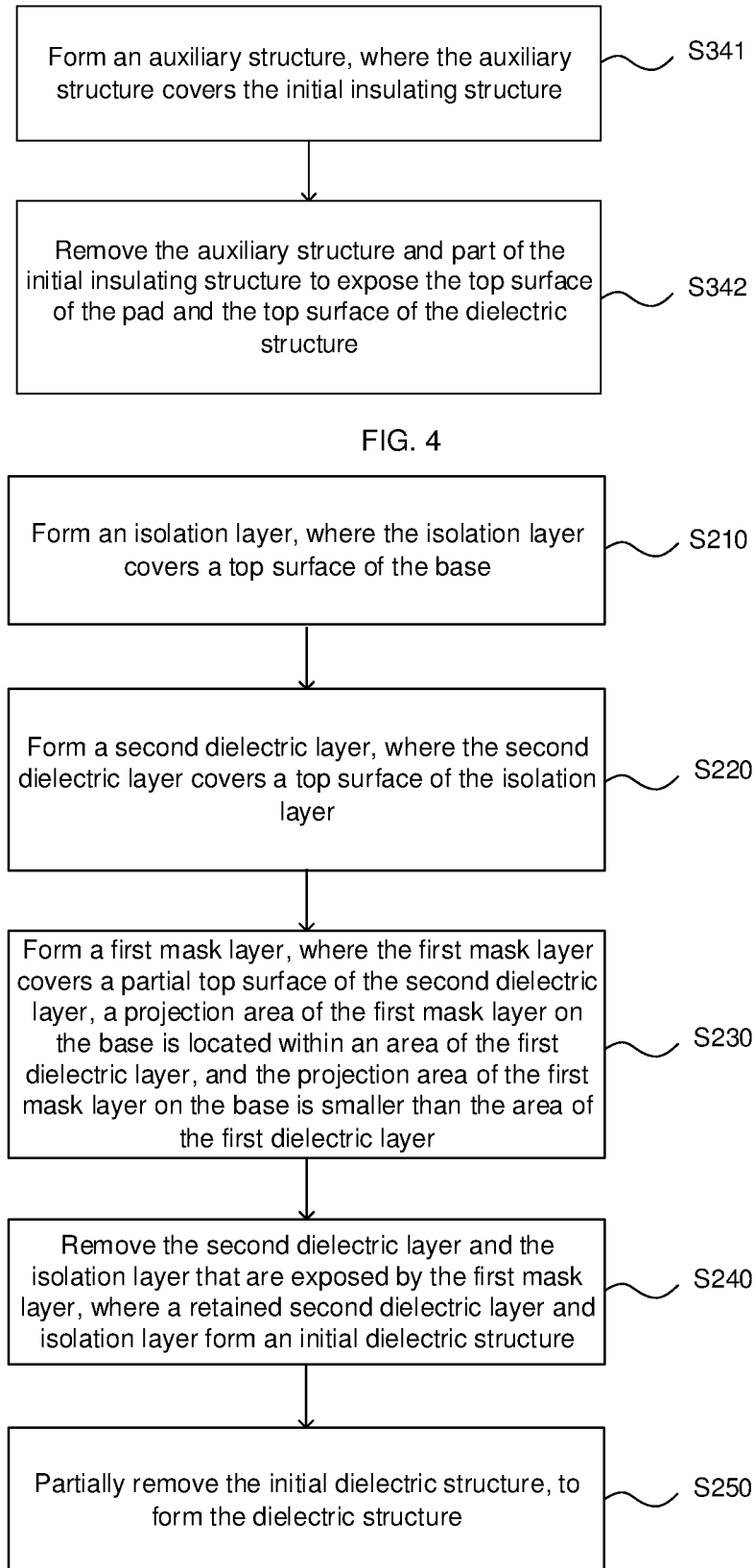
FIG. 4 is a flowchart of partially removing the initial insulating structure in a method of forming a semiconductor structure according to an exemplary embodiment.
FIG. 5 is a flowchart of forming dielectric structures in a method of forming a semiconductor structure according to an exemplary embodiment.

According to an exemplary embodiment, this embodiment is a description of the implementation of step S320 of the foregoing embodiment. As shown in FIG. 4, FIG. 4 is a flowchart of step S340 of partially removing the initial insulating structure in a method of forming a semiconductor structure according to this embodiment, including the following steps:

Step S341: Form an auxiliary structure, where the auxiliary structure covers the initial insulating structure.

As shown in FIG. 19 with reference to FIG. 18, the auxiliary structure 700 may be formed through atomic layer deposition (ALD). A material of the auxiliary structure 700 may include silicon oxide (SiO$_2$), silicon nitride (SiN) or silicon oxynitride (SiON). The material of the auxiliary structure 700 is the same as the material of the initial insulating structure 310.

Step S342: Remove the auxiliary structure and part of the initial insulating structure to expose the top surface of the pad and the top surface of the dielectric structure.

As shown in FIG. 20 with reference to FIG. 19, in this embodiment, the step of removing the auxiliary structure 700 and part of the initial insulating structure 310 is as follows:

The auxiliary structure 700 is partially removed through etching, so as to expose the initial insulating structure 310 covering the pad 120 and the initial insulating structure 310 covering the top surface of the dielectric structure 200. The auxiliary structure 700 may be etched anisotropically through dry etching. During etching of the auxiliary structure 700, an etching speed in the vertical direction is higher than an etching speed in the horizontal direction, to remove the auxiliary structure 700 covering the top surface of the pad 120 and the top surface of the dielectric structure 200 as well as part of the auxiliary structure 700 covering the sidewall of the dielectric structure 200, and expose the initial insulating structure covering the pad 120 and the initial insulating structure 310 covering the top surface of the dielectric structure.

The remaining auxiliary structure 700 and the exposed initial insulating structure 310 are continuously etched anisotropically through dry etching, where an etching speed in the vertical direction is higher than an etching speed in the horizontal direction, to remove the auxiliary structure 700, the initial insulating structure 310 covering the pad 120, and the initial insulating structure 310 covering the top surface of the dielectric structure 200.

In this embodiment, the auxiliary structure is formed on the initial insulating structure. Based on a difference between the etching speeds of the etching process in the vertical direction and the horizontal direction, the auxiliary structure and the initial insulating structure that covers the pad and the top surface of the dielectric structure are removed through etching, to expose the top surface of the pad to facilitate forming the conductive structure on the pad subsequently. The initial insulating structure covering the sidewall of the dielectric structure is retained during etching, to ensure that the air gap is provided between the insulating structure and sidewall in the middle in a sealed manner without being damaged, thereby maintaining the integrity and sealing property of the air gap.

According to an exemplary embodiment, this embodiment is a description of the implementation of step S200 of the foregoing embodiment. As shown in FIG. 5, FIG. 5 is a flowchart of step S200 of forming dielectric structures in a method of forming a semiconductor structure according to this embodiment, including the following steps:

Step S210: Form an isolation layer, where the isolation layer covers a top surface of the base.

Referring to FIG. 8, a material of the isolation layer 130 may include silicon oxide (SiO$_2$), silicon nitride (SiN) or silicon oxynitride (SiON).

Step S220: Form a second dielectric layer, where the second dielectric layer covers a top surface of the isolation layer.

Referring to FIG. 8, a material of the second dielectric layer 140 may be a low-K material.

Step S230: Form a first mask layer, where the first mask layer covers a partial top surface of the second dielectric layer, a projection area of the first mask layer on the base is located within an area of the first dielectric layer, and the projection area of the first mask layer on the base is smaller than the area of the first dielectric layer.

Figure 9:
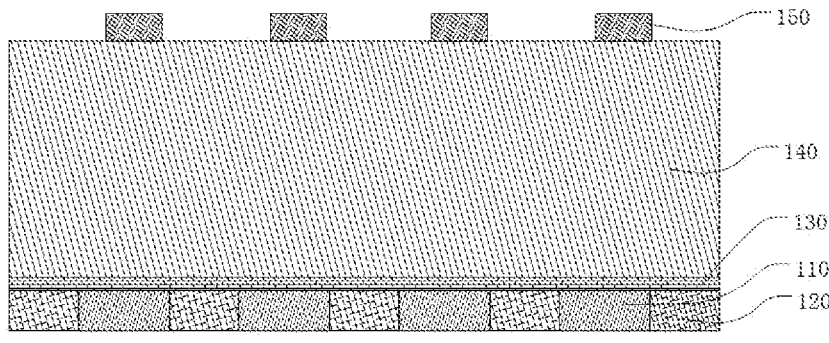
FIG. 9 is a schematic diagram of forming a first mask layer on a second dielectric layer in a method of forming a semiconductor structure according to an exemplary embodiment.

As shown in FIG. 9 with reference to FIG. 8, the first mask layer 150 is formed on the top surface of the second dielectric layer 140, and the projection area of the first mask layer 150 on the base 100 is within the area of the first dielectric layer 110, and the projection area of the first mask layer 150 on the base 100 is smaller than the area of the first dielectric layer 110. In the embodiment of the present disclosure, at least one side edge of the projection area of the first mask layer 150 on the base 100 is spaced apart from the edge of the first dielectric layer 110 at the same side. That is, at least one side of the initial dielectric structure 201 obtained by etching according to the first mask layer 150 is provided with space for forming the air gap 400 in the subsequent step. In some embodiments of the present disclosure, both side edges of the projection area of the first mask layer 150 on the base 100 are spaced apart from both side edges of the first dielectric layer 110. That is, both sides of the initial dielectric structure 201 obtained through etching according to the first mask layer 150 are provided with space for forming the air gap 400 in the subsequent step.

Step S240: Remove the second dielectric layer and the isolation layer that are exposed by the first mask layer, where a retained second dielectric layer and isolation layer form an initial dielectric structure.

Figure 10:
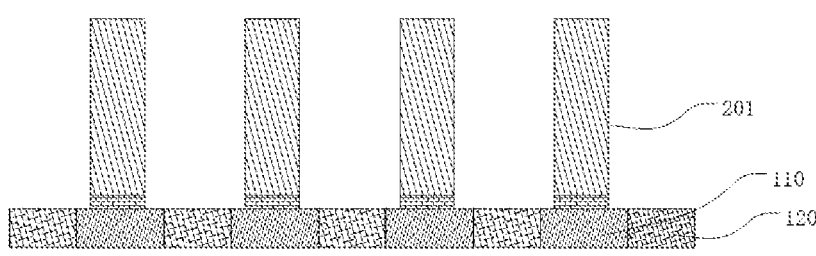
FIG. 10 is a schematic diagram of forming initial dielectric structures in a method of forming a semiconductor structure according to an exemplary embodiment.

As shown in FIG. 10 with reference to FIG. 9, the second dielectric layer 140 and the isolation layer 130 that are exposed by the first mask layer 150 are removed through dry etching or wet etching. By using the top surface of the first dielectric layer 110 as an etching stop layer, etching is stopped when the top surface of the first dielectric layer 110 is exposed, to form the initial dielectric structure 201.

Step S250: Partially remove the initial dielectric structure, to form the dielectric structure.

As shown in FIG. 13 with reference to FIG. 10, the initial dielectric structure 201 is partially removed, and space for forming the air gap 400 subsequently is provided on the initial dielectric structure 201, and the retained initial dielectric structure 201 serves as the dielectric structure 200.

In this embodiment, projection of the first mask layer 150 on the first dielectric layer 110 is greater than ½ of the width of the first dielectric layer 110. Both side edges of the projection of the first mask layer 150 on the first dielectric layer 110 are spaced apart from both side edges of the first dielectric layer 110. The dielectric structure 200 formed according to the first mask layer 150 has a stable structure and achieves a good effect of reducing interference between adjacent conductive structures 500, thereby achieving an even better effect of reducing the parasitic capacitance between the conductive structures 500.

The initial dielectric structure formed in this embodiment dose not cover the top surface of the pad and the partial top surface of the first dielectric layer. Space for forming the air gap is provided at side edges of the initial dielectric structure, such that the air gap is formed on the sidewall of the subsequently formed dielectric structure.

According to an exemplary embodiment, this embodiment is a description of the implementation of step S250 of the foregoing embodiment. As shown in FIG. 6, FIG. 6 is a flowchart of step S250 of partially removing the initial dielectric structure to form the dielectric structure in a method of forming a semiconductor structure according to this embodiment, including the following steps:

Step S251: Form a hard mask layer, where the hard mask layer covers the initial dielectric structure as well as the pad and part of the first dielectric layer that are exposed by the initial dielectric structure.

Figure 11:
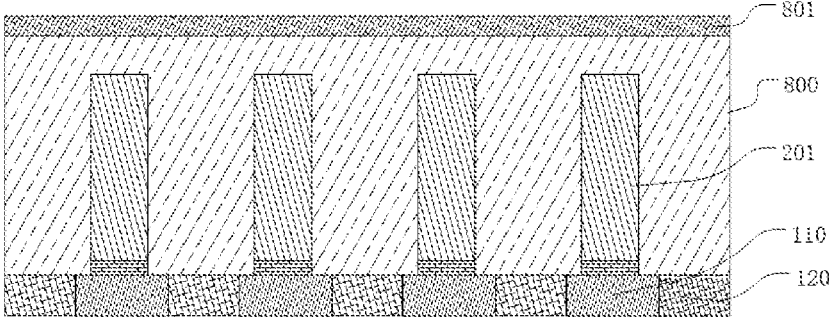
FIG. 11 is a schematic diagram of forming a hard mask layer in a method of forming a semiconductor structure according to an exemplary embodiment.

As shown in FIG. 11 with reference to FIG. 10, a hard mask material is spin-coated. The spin-coated material fills up the trench between the initial dielectric structures 201 and covers the initial dielectric structure 201, to form the hard mask layer 800.

Step S252: Form an etching stop layer, where the etching stop layer covers the hard mask layer.

As shown in FIG. 11 with reference to FIG. 10, the etching stop layer 801 is formed, where the etching stop layer 801 covers the hard mask layer 800. In this embodiment, a material of the etching stop layer 801 includes silicon nitride.

Step S253: Form a second mask layer, where the second mask layer covers part of the etching stop layer, and a projection area of the second mask layer on the base is located within a projection area of the initial dielectric structure on the base.

Figure 12:
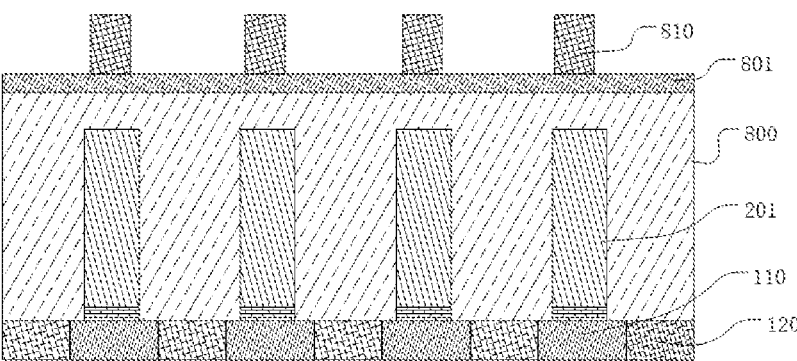
FIG. 12 is a schematic diagram of forming a second mask layer on a hard mask layer in a method of forming a semiconductor structure according to an exemplary embodiment.

As shown in FIG. 12 with reference to FIG. 11, the second mask layer 810 is formed. The second mask layer 810 covers the partial top surface of the etching stop layer 801. The projection of the second mask layer 810 on the base 100 is located within the projection area of the initial dielectric structure 201 on the base 100, and the projection area of the second mask layer 810 on the base 100 is smaller than the projection area of the initial dielectric structure 201 on the base 100. In the embodiment of the present disclosure, at least one side edge of the projection area of the second mask layer 810 on the base 100 is spaced apart from the edge of the projection formed by the initial dielectric structure 201 at the same side on the base 100. In some embodiments of the present disclosure, both side edges of the projection area of the second mask layer 810 on the base 100 are spaced apart from both side edges of the projection area of the initial dielectric structure 201 on the base 100.

Step S254: Remove the etching stop layer, part of the hard mask layer and part of the second dielectric layer based on the second mask layer, where a retained initial dielectric structure forms the dielectric structure.

The retained isolation layer serves as an isolation portion of the dielectric structure, and the retained second dielectric layer serves as a dielectric portion of the dielectric structure. The dielectric portion includes a first part and a second part. Projection of the first part of the dielectric portion on the first dielectric layer or projection of the isolation portion on the base, and a projection area of the second part of the dielectric portion on the first dielectric layer is located within a projection area of the first part of the dielectric portion on the first dielectric layer.

As shown in FIG. 13 with reference to FIG. 12, the etching stop layer 801 exposed by the second mask layer 810 is removed based on the second mask layer 810, and the pattern of the second mask layer 810 is transferred to the hard mask layer 800, to remove the hard mask layer 800 covered by the pattern of the second mask layer 810, and the pattern of the second mask layer 810 is transferred to the initial dielectric structure 201. Part of the second dielectric layer 140 not covered by the projection of the second mask layer 810 is removed from the initial dielectric structure 201 according to the pattern of the second mask layer 810, and the retained initial dielectric structure 201 forms the dielectric structure 200. The dielectric structure 200 is provided on the first dielectric layer 110, the width of the first part 221 of the dielectric portion 220 is equal to that of the isolation portion 210, and the width of the second part 222 of the dielectric portion 220 is smaller than that of the first part 221 of the dielectric portion 220. That is, at least one side of the second part 222 of the dielectric portion 220 is provided with space for forming the air gap 400 in the subsequent step.

In the dielectric structure formed in this embodiment, the side edge of the isolation portion and the side edge of the second part of the dielectric portion are each provided with space for forming the air gap. The insulating structure is formed on the sidewall of the dielectric structure formed in this embodiment. Two air gaps can be formed between the insulating structure and the dielectric structure, to increase the proportion of the air gap, thereby reducing the parasitic capacitance between the subsequently formed conductive structures.

According to an exemplary embodiment, this embodiment is a description of the implementation of step S300 of the foregoing embodiment. The insulating structure is formed in step S300. The insulating structure covers the sidewall of the first part of the dielectric portion and a partial sidewall of the second part of the dielectric portion. A first air gap is formed between the insulating structure and the sidewall of the isolation portion, and a second air gap is formed between the insulating structure and a partial sidewall of the second part of the dielectric portion.

As the sacrificial structure 600 covers a larger area of the sidewall of the dielectric structure 200, the formed air gap 400 accounts for a higher volume proportion relative to the dielectric structure 200, which achieves a better effect of reducing the parasitic capacitance between the conductive structures 500. On the other hand, as the insulating structure 300 covers a smaller area of the sidewall of the dielectric structure 200, the stability of the insulating structure 300 affected, and the insulating structure 300 is prone to tipping. As shown in FIG. 20 and FIG. 21 with reference to FIG. 13, the first air gap 410 is formed between the insulating structure 300 and the sidewall of the isolation portion 210, and the second air gap 420 is formed between the insulating structure 300 and a partial sidewall of the second part 222 of the dielectric portion 220. The insulating structure 300 covers the sidewall of the first part 221 of the dielectric portion 220 and the partial sidewall, which is above the second air gap 420, of the second part 222 of the dielectric portion 220.

In this embodiment, the first air gap 410 and the second air gap 420 are provided between the insulating structure 300 and the dielectric structure 200 in a sealed manner, to increase the proportion of the air gap 400 and better reduce the parasitic capacitance between the conductive structures 500. Moreover, the insulating structure 300 formed in this step is more stable and solid.

According to an exemplary embodiment, this embodiment is a description of the implementation of step S400 of the foregoing embodiment. As shown in FIG. 7, FIG. 7 is a flowchart of step S400 of forming conductive structures in a method of forming a semiconductor structure according to this embodiment, including the following steps:

S410: Form a barrier layer, where the barrier layer covers the insulating structure, a top surface of the dielectric structure and the exposed pad.

Figure 22:
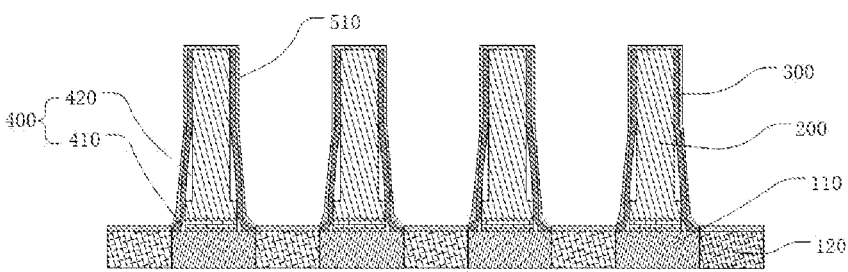
FIG. 22 is a schematic diagram of forming a barrier layer in a method of forming a semiconductor structure according to an exemplary embodiment.

As shown in FIG. 22 with reference to FIG. 20, the barrier layer 510 may be formed through atomic layer deposition (ALD). A material of the barrier layer 510 may include tantalum (Ta) or a tantalum compound. In this embodiment, the material of the barrier layer 510 is tantalum (Ta).

S420: Form a seed layer, where the seed layer covers the barrier layer.

Figure 23:
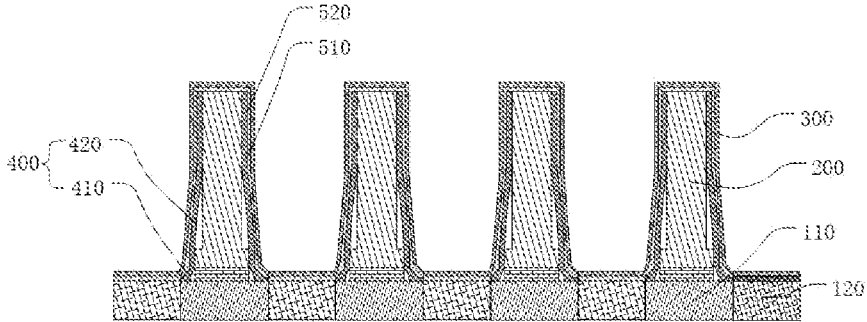
FIG. 23 is a schematic diagram of forming a seed layer in a method of forming a semiconductor structure according to an exemplary embodiment.

As shown in FIG. 23 with reference to FIG. 22, copper is deposited on the barrier layer 510 through physical vapor deposition (PVD) to form the seed layer 520. At a temperature of 180° C. to 250° C., the seed layer 520 is pre-annealed for 20 to 40 seconds, to promote growth of copper lattices of the seed layer 520. Gaps between the copper lattices in the seed layer 520 are filled, such that the copper lattices of the seed layer 520 are uniform and continuous, to reduce the resistance of the seed layer 520 and improve the conductivity of the seed layer 520. In this way, the formed conductive structures 500 have continuous conductivity.

S430: Form a conductive layer, where the conductive layer is grown on the seed layer.

Figure 24:
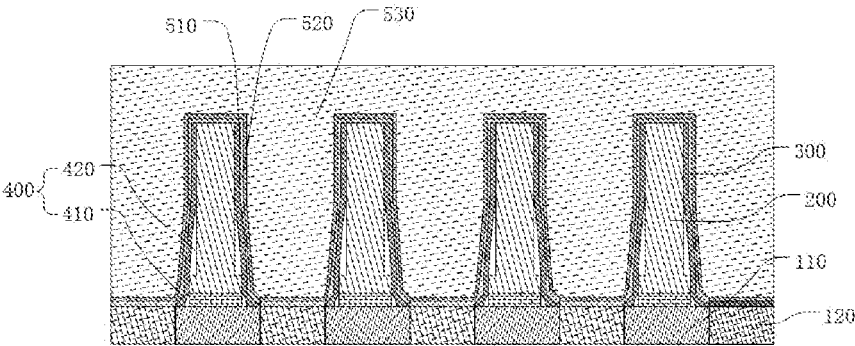
FIG. 24 is a schematic diagram of forming a conductive layer in a method of forming a semiconductor structure according to an exemplary embodiment.

As shown in FIG. 24 with reference to FIG. 23, copper is deposited through electroplating. The copper is grown on the copper lattices of the seed layer 520 to form the conductive layer 530.

S440: Remove part of the conductive layer, part of the seed layer, part of the barrier layer, part of the insulating structure and part of the dielectric structure, to form the conductive structure.

Part of the conductive layer 530, part of the seed layer 520, part of the barrier layer 510, part of the insulating structure 300 and part of the dielectric structure 200 are removed through chemical-mechanical polishing (CMP), to form the conductive structure 500. The top surface of the conductive structure 500 is flush with the top surface of the dielectric structure 200.

In some embodiments of the present disclosure, as shown in FIG. 25 with reference to FIG. 24, part of the dielectric structure 200 may also be removed during chemical-mechanical polishing (CMP), provided that the CMP stops above the second air gap 420, such that the second air gap 420 is provided between the insulating structure 300 and the dielectric structure 200 in a sealed manner.

In the semiconductor structure formed in this embodiment, the conductive structures are separated by the dielectric structure, the insulating structure and the air gap, and the air gap has a low dielectric constant, thereby reducing the parasitic capacitance between the conductive structures.

An exemplary embodiment of the present disclosure provides a semiconductor structure, which includes a base 100, a dielectric structure 200 provided on the base 100, an insulating structure 300 provided on a sidewall of the dielectric structure 200, and a conductive structure 500, as shown in FIG. 25. As shown in FIG. 25, the base 100 includes a first dielectric layer 110 and pads 120 that are arranged at intervals in the first dielectric layer 110. The dielectric structure 200 exposes the pad 120 and part of the first dielectric layer 110. A projection area of the dielectric structure 200 on the base 100 is within an area of the first dielectric layer 110, and the projection area of the dielectric structure 200 on the base 100 is smaller than the area of the first dielectric layer 110. The insulating structure 300 covers a first partial sidewall of the dielectric structure 200, an air gap 400 is provided between a second partial sidewall of the dielectric structure 200 and the insulating structure 300, and the conductive structure 500 covers the exposed pad 120 and an outer sidewall surface of the insulating structure 300.

In the semiconductor structure in this embodiment, the conductive structures 500 are separated by the dielectric structure 200, the insulating structure 300, and the air gap 400 between the dielectric structure 200 and the insulating structure 300. The dielectric constant of air is close to 1, which can reduce the parasitic capacitance between the conductive structures 500.

According to an exemplary embodiment, the semiconductor structure of this embodiment is substantially the same as the foregoing embodiment, except that the dielectric structure 200 includes an isolation portion 210 located on the first dielectric layer 110 and a dielectric portion 220 located on the isolation portion 210, a first air gap 410 is provided between the insulating structure 300 and the isolation portion 210, and a second air gap is provided between the insulating structure and the dielectric portion, as shown in FIG. 13.

In the semiconductor structure of this embodiment, as shown in FIG. 25 with reference to FIG. 13, the first air gap 410 and the second air gap 420 are provided between the dielectric structure 200 and the insulating structure 300, which increases the volume proportion of the air gap and achieves a better effect of reducing the parasitic capacitance between the conductive structures 500.

According to an exemplary embodiment, the semiconductor structure of this embodiment is substantially the same as the foregoing embodiment, except that the dielectric portion 220 includes a first part 221 and a second part 222, projection of the first part 221 of the dielectric portion 220 on the base 100 or projection of the isolation portion 210 on the base 100, and a projection area of the second part 222 of the dielectric portion 220 on the base 100 is within a projection area of the first part 221 of the dielectric portion 220 on the base 100, as shown in FIG. 13.

As shown in FIG. 25 with reference to FIG. 13, the insulating structure 300 covers a sidewall of the first part 221 of the dielectric portion 220 and a partial sidewall of the second part 222 of the dielectric portion 220, and the second air gap 420 is formed between the insulating structure 300 and another partial sidewall of the second part 222 of the dielectric portion 220.

According to an exemplary embodiment, the semiconductor structure of this embodiment is substantially the same as the foregoing embodiment, except that the conductive structure 500 includes a barrier layer 510 covering a sidewall of the insulating structure 300 and exposing the pad 120, a seed layer 520 covering the barrier layer 510, and a conductive layer 530 covering the seed layer 520.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the present disclosure, adjacent conductive structures in the semiconductor structure are separated by the dielectric structure, the insulating structure, and the air gap. The air gap reduces the parasitic capacitance between the conductive structures.

The invention claimed is:

1. A method of forming a semiconductor structure, comprising:

providing a base, wherein the base comprises a first dielectric layer and pads arranged at intervals in the first dielectric layer;

forming a dielectric structure, wherein the dielectric structure exposes the pad and part of the first dielectric layer;

forming an insulating structure, wherein the insulating structure is formed on a sidewall of the dielectric structure, the insulating structure covers a first partial sidewall of the dielectric structure, and an air gap is formed between a second partial sidewall of the dielectric structure and the insulating structure; and forming a conductive structure, wherein the conductive structure covers an exposed pad and an outer sidewall surface of the insulating structure.

2. The method of forming the semiconductor structure according to claim 1, wherein the forming an insulating structure comprises:

forming a sacrificial structure, wherein the sacrificial structure covers the second partial sidewall of the dielectric structure;

forming an initial insulating structure, wherein the initial insulating structure covers the sacrificial structure, an exposed first partial sidewall of the dielectric structure, and the exposed pad;

removing the sacrificial structure to form the air gap between the initial insulating structure and the dielectric structure; and partially removing the initial insulating structure to expose a top surface of the pad and a top surface of the dielectric structure, wherein a retained initial insulating structure forms the insulating structure.

3. The method of forming the semiconductor structure according to claim 2, wherein the forming a sacrificial structure comprises:

forming an initial sacrificial structure, wherein the initial sacrificial structure covers the dielectric structure and the pad; and partially removing the initial sacrificial structure to expose the pad and part of the dielectric structure, wherein a retained initial sacrificial structure covers the second partial sidewall of the dielectric structure to form the sacrificial structure.

4. The method of forming the semiconductor structure according to claim 2, wherein the removing the sacrificial structure comprises:

etching to remove the sacrificial structure through reaction of oxygen-containing plasma, wherein a material of the sacrificial structure comprises carbide.

5. The method of forming the semiconductor structure according to claim 2, wherein before the partially removing the initial insulating structure, the method of forming the semiconductor structure further comprises:

forming an auxiliary structure, wherein the auxiliary structure covers the initial insulating structure; and the partially removing the initial insulating structure comprises:

removing the auxiliary structure and part of the initial insulating structure to expose the top surface of the pad and the top surface of the dielectric structure.

6. The method of forming the semiconductor structure according to claim 5, wherein the removing the auxiliary structure and part of the initial insulating structure comprises:

etching the auxiliary structure to remove part of the auxiliary structure, so as to expose the initial insulating structure covering the pad and the initial insulating structure covering the top surface of the dielectric structure; and etching a remaining auxiliary structure and an exposed initial insulating structure, to remove the auxiliary structure, the initial insulating structure covering the pad and the initial insulating structure covering the top surface of the dielectric structure.

7. The method of forming the semiconductor structure according to claim 6, wherein a material of the auxiliary structure is the same as a material of the initial insulating structure.

8. The method of forming the semiconductor structure according to claim 1, wherein the forming a dielectric structure comprises:

forming an isolation layer, wherein the isolation layer covers a top surface of the base;

forming a second dielectric layer, wherein the second dielectric layer covers a top surface of the isolation layer;

forming a first mask layer, wherein the first mask layer covers a partial top surface of the second dielectric layer, a projection area of the first mask layer on the base is located within an area of the first dielectric layer, and the projection area of the first mask layer on the base is smaller than the area of the first dielectric layer;

removing the second dielectric layer and the isolation layer that are exposed by the first mask layer, wherein a retained second dielectric layer and isolation layer form an initial dielectric structure; and partially removing the initial dielectric structure, to form the dielectric structure.

9. The method of forming the semiconductor structure according to claim 8, wherein the partially removing the initial dielectric structure comprises:

forming a hard mask layer, wherein the hard mask layer covers the initial dielectric structure as well as the pad and part of the first dielectric layer that are exposed by the initial dielectric structure;

forming an etching stop layer, wherein the etching stop layer covers the hard mask layer;

forming a second mask layer, wherein the second mask layer covers part of the etching stop layer, and a projection area of the second mask layer on the base is located within a projection area of the initial dielectric structure on the base; and removing the etching stop layer, the hard mask layer and part of the second dielectric layer based on the second mask layer, wherein a retained initial dielectric structure forms the dielectric structure, a retained isolation layer serves as an isolation portion of the dielectric structure, the retained second dielectric layer serves as a dielectric portion of the dielectric structure, the dielectric portion comprises a first part and a second part, projection of the first part of the dielectric portion on the first dielectric layer or projection of the isolation portion on the base, and a projection area of the second part of the dielectric portion on the first dielectric layer is located within a projection area of the first part of the dielectric portion on the first dielectric layer.

10. The method of forming the semiconductor structure according to claim 9, wherein the insulating structure covers a sidewall of the first part of the dielectric portion and a partial sidewall of the second part of the dielectric portion, a first air gap is formed between the insulating structure and a sidewall of the isolation portion, and a second air gap is formed between the insulating structure and the partial sidewall of the second part of the dielectric portion.

11. The method of forming the semiconductor structure according to claim 1, wherein the forming a conductive structure comprises:

forming a barrier layer, wherein the barrier layer covers the insulating structure, a top surface of the dielectric structure and the exposed pad;

forming a seed layer, wherein the seed layer covers the barrier layer;

forming a conductive layer, wherein the conductive layer is grown on the seed layer; and removing part of the conductive layer, part of the seed layer, part of the barrier layer, part of the insulating structure and part of the dielectric structure, to form the conductive structure.

* * * * *